US008520759B2

(12) United States Patent
Kim et al.

(10) Patent No.: US 8,520,759 B2
(45) Date of Patent: Aug. 27, 2013

(54) APPARATUS AND METHOD FOR DETECTING SIGNAL BASED ON LATTICE REDUCTION TO SUPPORT DIFFERENT CODING SCHEME FOR EACH STREAM IN MULTIPLE INPUT MULTIPLE OUTPUT WIRELESS COMMUNICATION SYSTEM

(75) Inventors: Eun-Yong Kim, Hwaseong-si (KR); Ju-Mi Lee, Seoul (KR); Eun-Seok Ko, Seongnam-si (KR); Sung-Soo Kim, Seoul (KR); Joo-Hwan Chun, Daejeon (KR)

(73) Assignees: Samsung Electronics Co., Ltd., Suwon-si (KR); Korea Advanced Institute of Science and Technology, Daejeon (KR)

( * ) Notice: Subject to any disclaimer, the term of this patent is extended or adjusted under 35 U.S.C. 154(b) by 1089 days.

(21) Appl. No.: 12/384,196

(22) Filed: Apr. 1, 2009

(65) Prior Publication Data

US 2009/0252242 A1    Oct. 8, 2009

(30) Foreign Application Priority Data

Apr. 2, 2008   (KR) .................. 10-2008-0030668

(51) Int. Cl.
  *H04B 7/02*   (2006.01)
(52) U.S. Cl.
  USPC ........................... 375/267; 375/260; 375/259
(58) Field of Classification Search
  USPC .................. 375/267, 259, 260; 455/59, 132, 455/504; 370/69.1
  See application file for complete search history.

(56) References Cited

U.S. PATENT DOCUMENTS

| | | | |
|---|---|---|---|
| 6,442,214 B1* | 8/2002 | Boleskei et al. | 375/299 |
| 6,658,605 B1* | 12/2003 | Yoshida et al. | 714/702 |
| 7,178,081 B2* | 2/2007 | Lee et al. | 714/752 |
| 7,469,014 B2* | 12/2008 | Abe et al. | 375/262 |
| 7,734,990 B2* | 6/2010 | Maru | 714/780 |
| 8,077,810 B2* | 12/2011 | Hansen et al. | 375/341 |
| 2004/0030979 A1* | 2/2004 | Shany et al. | 714/752 |
| 2005/0157811 A1* | 7/2005 | Bjerke et al. | 375/267 |
| 2007/0201632 A1* | 8/2007 | Ionescu | 379/88.01 |
| 2007/0286313 A1* | 12/2007 | Nikopour-Deilami et al. | 375/341 |
| 2008/0043864 A1* | 2/2008 | Fujii | 375/260 |
| 2008/0049863 A1* | 2/2008 | Heiskala | 375/267 |
| 2008/0168326 A1* | 7/2008 | Hwang et al. | 714/758 |
| 2010/0067614 A1* | 3/2010 | Koslov et al. | 375/295 |
| 2012/0114058 A1* | 5/2012 | Gan et al. | 375/267 |

\* cited by examiner

*Primary Examiner* — Shuwang Liu
*Assistant Examiner* — Helene Tayong

(57) ABSTRACT

An apparatus and method for detecting signals based on a Lattice Reduction (LR) algorithm in a Multiple Input Multiple Output (MIMO) wireless communication system are provided. The apparatus includes a plurality of operators for determining soft-decision values for respective streams by performing a soft modulo operation on respective symbol values included in a Receive (Rx) signal block multiplied by a lattice transformation matrix T, a plurality of inner decoders for determining Log Likelihood Ratio (LLR) values of codewords according to coding schemes for the respective streams by decoding the soft-decision values for the respective streams according to identical decoding scheme, a passer for restoring the LLR values representing the codewords generated in a transmitting end using the LLR values, and a plurality of outer decoders for determining LLR values of Transmit (Tx) bitstreams for the respective streams by decoding the LLR values representing the codewords generated in the transmitting end for the respective streams according to decoding schemes for the respective streams.

20 Claims, 8 Drawing Sheets

APPARATUS AND METHOD FOR DETECTING SIGNAL BASED ON LATTICE REDUCTION TO SUPPORT DIFFERENT CODING SCHEME FOR EACH STREAM IN MULTIPLE INPUT MULTIPLE OUTPUT WIRELESS COMMUNICATION SYSTEM

CROSS-REFERENCE TO RELATED APPLICATION(S) AND CLAIM OF PRIORITY

The present application claims the benefit under 35 U.S.C. §119(a) of a Korean patent application filed in the Korean Intellectual Property Office on Apr. 2, 2008 and assigned Serial No. 10-2008-0030668, the entire disclosure of which is hereby incorporated by reference.

TECHNICAL FIELD OF THE INVENTION

The present invention relates to a Multiple Input Multiple Output (MIMO) wireless communication system. More particularly, the present invention relates to an apparatus and method for detecting signals based on Lattice Reduction (LR) in a MIMO wireless communication system.

BACKGROUND OF THE INVENTION

In accordance with the increasing demands for high-speed and high-quality data transmissions, a Multiple-Input Multiple-Output (MIMO) wireless communication system using a plurality of transmit antennas and receive antennas is attracting much attention as a technique to meet those demands. In the MIMO scheme, communication can be performed using a plurality of streams through a plurality of antennas. Therefore, in comparison with the conventional technique using a single antenna, channel capacity can be significantly increased when using the MIMO scheme. For example, if a transmitting end and a receiving end use M Transmit (Tx) antennas and M Receive (Rx) antennas, respectively, a channel between the antennas is independent, and a bandwidth and entire Tx power are fixed, then an average channel capacity is increased M times higher than the case of using the single antenna.

A detection method for the MIMO wireless communication system is classified into a linear method and a non-linear method. A representative example of the linear detection method is a Zero Forcing (ZF) method. A representative example of the nonlinear detection method is a Maximum Likelihood (ML) method. The ZF method has low implementation complexity and low performance, whereas the ML method has high implementation complexity and high performance. To improve performance of the ZF method, a Minimum Mean Square Error (MMSE), a Successive Interference Cancelation (SIC), and the like, have been proposed. In addition, to decreasing implementation complexity of the ML method, Sphere Decoding (SD) has been proposed. That is, the detection method for the MIMO communication system aims at low implementation complexity and high performance. However, low implementation complexity generally has a trade-off relation with high performance. That is, low implementation complexity results in lower performance, and high performance results in high implementation complexity.

As another method for improving performance of the linear method such as the ZF method, a detection method using a Lattice Reduction (LR) algorithm has been proposed. The LR algorithm is an algorithm for finding a unimodular matrix T consisting of integer elements to improve a condition number of a channel matrix. However, since the detection method based on the LR algorithm includes a quantization operation in a detection process, an interoperation with channel coding is not easy.

To address this problem, an LR based List generating (or simply List-LR) method in which the detection method is improved using the LR algorithm has been proposed. However, the List-LR method has significantly high complexity due to an operation of generating a list of symbol vectors. Further, when the List-LR method is used, the number of elements included in a symbol vector may increase as the number of antennas increases or the number of types of elements that can be selected may increase as a modulation size of each transmit signal increases. In this case, complexity of the detection method increases. Accordingly, the List-LR method does not have low complexity and fixed complexity that are advantages of the detection method based on the LR algorithm.

SUMMARY OF THE INVENTION

To address the above-discussed deficiencies of the prior art, it is a primary aspect of the present invention to provide an apparatus and method for detecting signals using a Lattice Reduction (LR) algorithm in a Multiple Input Multiple Output (MIMO) wireless communication system.

Another aspect of the present invention is to provide an apparatus and method for detecting signals based on an LR algorithm to support different coding schemes for respective streams in a MIMO wireless communication system.

Another aspect of the present invention is to provide an apparatus and method for detecting signals based on an LR algorithm to support different coding schemes for respective streams by performing dual decoding in a MIMO wireless communication system.

In accordance with an aspect of the present invention, a receiving-end apparatus having a plurality of Receive (Rx) antennas in a MIMO wireless communication system is provided. The apparatus includes a plurality of operators for determining soft-decision values for respective streams by performing a soft modulo operation on respective symbol values included in an Rx signal block multiplied by a lattice transformation matrix T, a plurality of inner decoders for determining Log Likelihood Ratio (LLR) values of codewords according to coding schemes for the respective streams by decoding the soft-decision values for the respective streams according to identical decoding scheme, a passer for restoring the LLR values representing the codewords generated in a transmitting end using the LLR values, and a plurality of outer decoders for determining LLR values of Transmit (Tx) bitstreams for the respective streams by decoding the LLR values representing the codewords generated in the transmitting end for the respective streams according to decoding schemes for the respective streams.

In accordance with another aspect of the present invention, a transmitting-end apparatus having at least one Tx antenna in a MIMO wireless communication system is provided. The apparatus includes at least one outer coder for performing outer coding on Tx bitstreams for respective streams, at least one inner coder for performing inner coding on at least one codeword generated by outer coding, at least one modulator for modulating at least one second order codeword generated by the second coding to convert the second order codeword into complex symbols, and at least one transmitter for transmitting the complex symbols through at least one Tx antenna.

In accordance with another aspect of the present invention, a method of operating a receiving end having a plurality of Rx antennas in a MIMO wireless communication system is provided. The method includes determining soft-decision values for respective streams by performing a soft modulo operation on respective symbol values included in an Rx signal block multiplied by a lattice transformation matrix T, determining LLR values of codewords according to coding schemes for the respective streams by decoding the soft-decision values for the respective streams according to identical decoding scheme, restoring the LLR values representing the codewords generated in a transmitting end using the LLR values, and determining LLR values of Tx bitstreams for the respective streams by decoding the LLR values representing the codewords generated in the transmitting end for the respective streams according to decoding schemes for the respective streams.

In accordance with another aspect of the present invention, a method of operating a transmitting end having at least one Tx antenna in a MIMO wireless communication system is provided. The method includes performing outer coding on Tx bitstreams for respective streams, performing inner coding on at least one codeword generated by outer coding, modulating at least one second order codeword generated by the second coding to convert the second order codeword into complex symbols, and transmitting the complex symbols through at least one Tx antenna.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION OF THE INVENTION

FIG. 1 through 8, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged wireless communication system.

The present invention described below relates to a technique for supporting a signal detection method based on a Lattice Reduction (LR) algorithm combined with channel coding in a Multiple Input Multiple Output (MIMO) wireless communication system. For convenience of explanation, the signal detection method based on the LR algorithm is hereinafter referred to as an 'LR detection method'.

Figure 1:
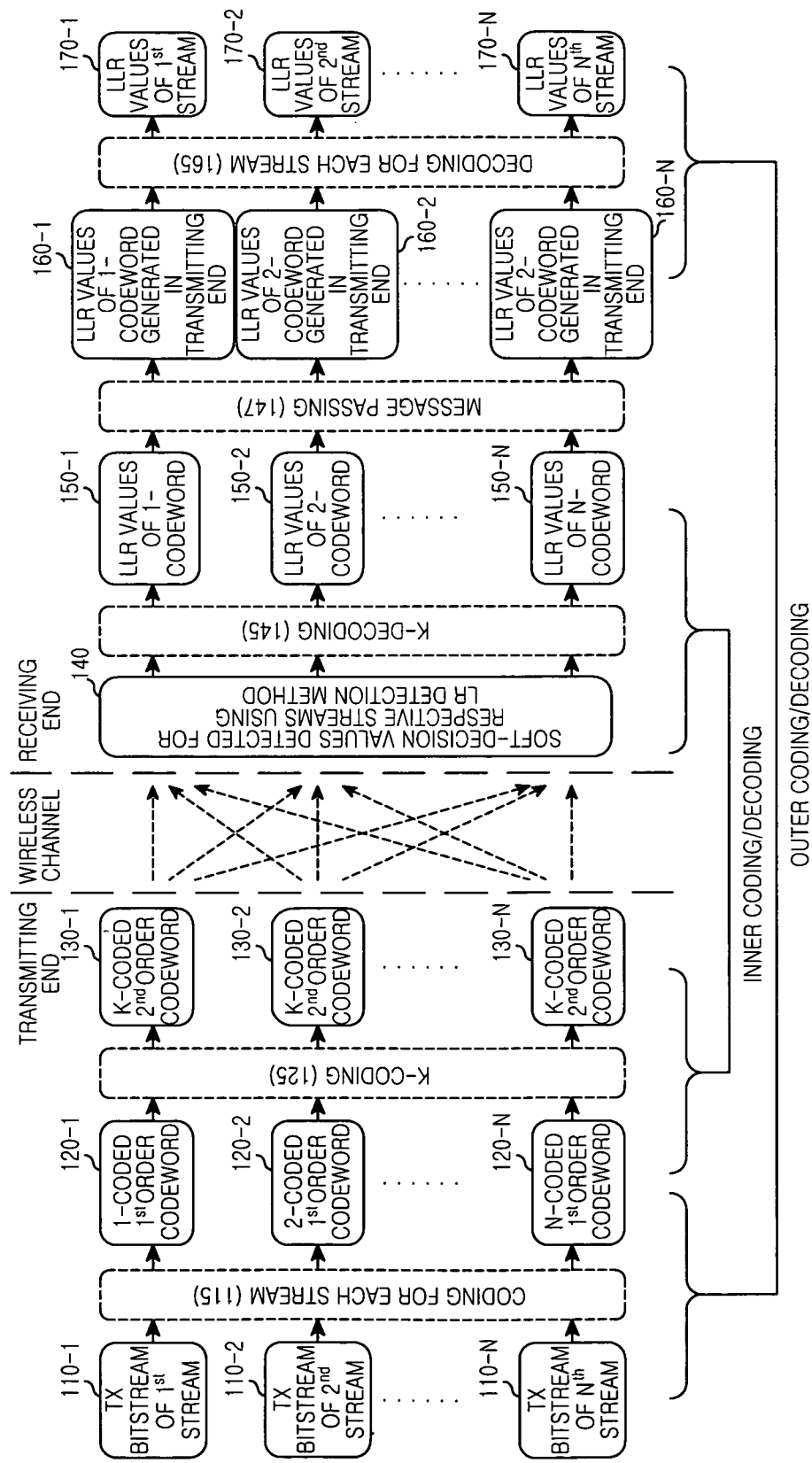
FIG. 1 is a schematic view illustrating a process of transmitting and receiving a bitstream in a Multiple Input Multiple Output (MIMO) wireless communication system according to an exemplary embodiment of the present invention.

FIG. 1 is a schematic view illustrating an operation of processing bitstreams for respective streams in a MIMO wireless communication system according to an exemplary embodiment of the present invention.

A transmitting end is one of a single node using N Transmit (Tx) streams and a plurality of nodes using a total of N Tx streams. A receiving end is a single node using N Receive (Rx) streams. For explanation purposes only, in FIG. 1 and the following description, a 'codeword coded according to an $n^{th}$ scheme' is referred to as an 'n-coded codeword', a 'codeword restored by decoding according to the $n^{th}$ scheme' is referred to as an 'n-codeword', a 'coding according to the $n^{th}$ scheme' is referred to as 'n-coding', and a 'decoding according to the $n^{th}$ scheme' is referred to as 'n-decoding'.

Referring to FIG. 1, Tx bitstreams 110-1 to 110-N are provided respectively for $1^{st}$ to $N^{th}$ streams, and each Tx bitstream is coded according to a coding scheme corresponding to each stream. For example, the Tx bitstreams 110-1 to 110-N are subjected to a coding operation 115 for the respective streams according to different coding rates and coding schemes. For the respective streams, the Tx bitstreams are coded according to the different coding schemes, and are then converted into first order codewords 120-1 to 120-N. Thereafter, the bitstreams coded according to the different coding schemes, that is, the first order codewords 120-1 to 120-N for the respective streams are subjected to a K-coding operation 125 and thus are converted into second order codewords 130-1 to 130-N for the respective streams.

The second order codewords 130-1 to 130-N for the respective streams are converted into Radio Frequency (RF) signals by performing modulation and up-conversion, and are delivered to the receiving end through a wireless channel. In this case, the receiving end is a single node using N Rx antennas. It is assumed that a channel between the receiving end and the transmitting end is fixed during a time when the second order codewords are transmitted.

The received RF signals are converted into baseband signals. The receiving end performs a soft modulo operation on the baseband signals using the LR detection method, and thus generates soft decision values 140 for the respective streams. In this case, according to the LR detection method, the second order codewords are linearly summed by being multiplied by a lattice transformation matrix T. The soft decision values 140 for the respective streams are K-codewords but may differ from the second order codewords generated at the transmitting end. That is, the linearly summed codewords include the K-codewords. However, as types of codewords are shapely increased, complexity for determining the soft decision values 140 for the linearly summed codewords is significantly large. Therefore, the soft modulo operation is used to determine the soft decision values 140 for the respective streams with low complexity. The soft modulo operation is used not to induce soft-decision values of all of computable linearly summed codewords but to determine soft-decision values only for candidates selected from the linearly summed codewords. Selection of the candidates is determined according to a modulation scheme of the transmitting end. For example, if a P level-Amplified-Shift-Keying (P-ASK) scheme is used in the transmitting end, a conditional probability decision value for an Rx signal is expressed by Equation 1 below.

$$p^{**}(s_j | \tilde{y}_j) \approx \min_{\{a \in [\tilde{y}_j + \Delta] \cap [a - s_j]_P = 0\}} \left[ \frac{1}{2\tilde{\sigma}_j^2} |\tilde{y}_j - a|^2 \right] \quad [\text{Eqn. 1}]$$

$$= \frac{1}{2\tilde{\sigma}_j^2} \left| \tilde{y}_j - \left( P \cdot Q\left\{ \frac{(\tilde{y}_j - s_j)}{P} \right\} + s_j \right) \right|^2$$

In Equation 1 above, $s_j$ denotes $j^{th}$ transmittable symbol, $\tilde{y}_j$ denotes $j^{th}$ element of received signal vector after LR algorithm, $p^{**}(s_j | \tilde{y}_j)$ denotes a probability that $s_j$ is transmitted when $\tilde{y}_j$ is received, $\Delta$ denotes a codeword lattice in transmitting end, P denotes a modulation level in transmitting end, $\tilde{\sigma}_j^2$ denotes a power of noise after LR algorithm, Q{ } denotes lattice rounding operator.

For example, if Binary-Phase-Shift-Keying (BPSK) is used as the modulation scheme, a round-off lattice operator is represented with an odd/even detector. In this case, the soft-decision values are calculated by Equation 2 below.

$$L(c_i | \tilde{y}_j) \approx C_{c_i} - 4 \frac{\tilde{E}_s}{2\tilde{\sigma}_j^2} \left( \tilde{y}_j - \frac{\tilde{y}_o + \tilde{y}_e}{2} \right) \left( \frac{\tilde{y}_o - \tilde{y}_e}{2} \right) \quad [\text{Eqn. 2}]$$

In Equation 2 above, $c_i$ denotes a bit transmitted from $j^{th}$ transmitting end, $\tilde{y}_j$ denotes $j^{th}$ element of received signal vector after LR algorithm, $C_{c_i}$ denotes a variable representing a priori probability on transmit bit, $\tilde{E}_s$ denotes transmitting power of each transmitting end, $\tilde{\sigma}_j^2$ denotes a power of noise after LR algorithm, $\tilde{y}_o$ denotes the nearest odd number to $\tilde{y}_j$, $\tilde{y}_e$ denotes the nearest even number to $\tilde{y}_j$. Herein, the variable $C_{c_i}$ is '0' when probabilities to transmit bit 1 and bit 0 are identically 1/2.

The soft decision values 140 are subjected to a K-decoding operation 145 for the respective streams, and thus are converted into Log Likelihood Ratio (LLR) values of codewords 150-1 to 150-N conforming to the coding schemes for the respective streams. However, the LLR values of the codewords 150-1 to 150-N may be different from the LLR values of the first order codewords 120-1 to 120-N generated in the transmitting end. This is because the LLR values of the codewords 150-1 to 150-N are obtained from the second order codewords 130-1 to 130-N that are subjected to linear summation and the modulo operation. Therefore, by performing a message passing operation 147, the receiving end converts the LLR values of the codewords 150-1 to 150-N into LLR values of the first order codewords generated in the transmitting end 160-1 to 160-N. Further, for the respective streams, the receiving end performs a decoding operation 165 on the LLR values of the first order codewords 160-1 to 160-N according to schemes corresponding to first coding schemes of the transmitting end, and thus obtains LLR values of the Tx bitstreams 170-1 to 170-N.

In the aforementioned operations of the transmitting end and the receiving end, a process for generating the first order codewords in the transmitting end is referred to as outer coding, and a process for generating the second order codewords in the transmitting end is referred to as inner coding. Further, a process for generating the soft-decision values for the respective streams and decoding corresponding to a second order coding scheme in the receiving end is referred to as inner decoding, and a process for decoding corresponding to a first order coding scheme in the receiving end is referred to as outer decoding. That is, a process for generating the first order codewords and decoding corresponding to the first order coding scheme are referred to as outer coding/decoding, and a process for generating the second order codewords by the transmitting end and decoding corresponding to the second order coding scheme of the receiving end are referred to as inner coding/decoding.

Hereinafter, structures of the transmitting end and the receiving end for transmitting and receiving bitstreams as aforementioned will be described in detail with reference to the accompanying drawings.

Figure 2:
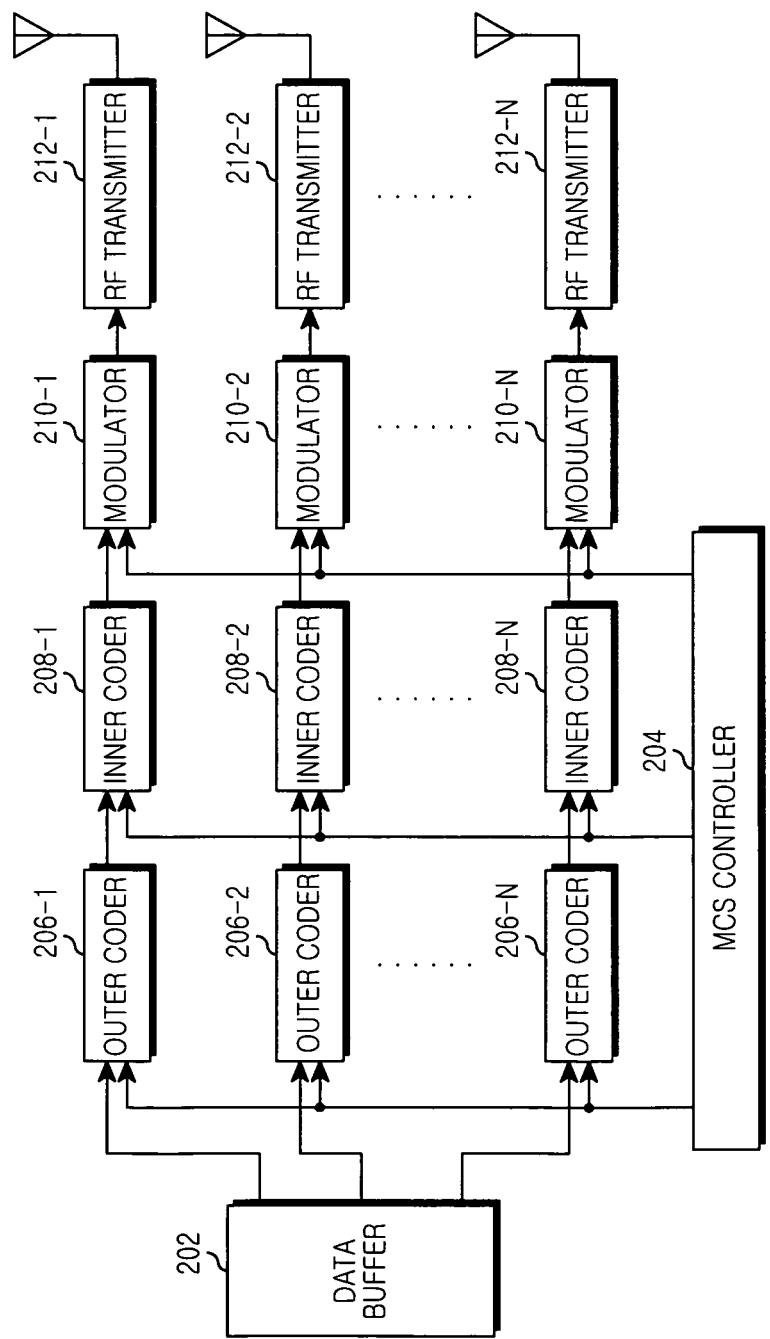
FIG. 2 is a block diagram illustrating a structure of a transmitting end in a MIMO wireless communication system according to an exemplary embodiment of the present invention.

FIG. 2 is a block diagram illustrating a structure of a transmitting end in a MIMO wireless communication system according to an exemplary embodiment of the present invention. BPSK is used in the transmitter having the structure of FIG. 2.

Referring to FIG. 2, the transmitting end includes a data buffer 202, a Modulation and Coding Scheme (MCS) controller 204, a plurality of outer coders 206-1 to 206-N, a plurality of inner coders 208-1 to 208-N, a plurality of modulators 210-1 to 210-N, and a plurality of RF transmitters 212-1 to 212-N.

The data buffer 202 stores Tx bitstreams for respective streams, and provides the Tx bitstreams to the outer coders 206-1 to 206-N. The MCS controller 204 provides MCS levels for the respective streams determined according to channel quality between the transmitting end and a receiving end to the outer coders 206-1 to 206-N, the inner coders 208-1 to 208-N, and the modulators 210-1 to 210-N. In this case, the MCS controller 204 directly determines the MCS levels for the respective streams using channel quality information, or uses MCS levels determined by the receiving end.

Each of the outer coders 206-1 to 206-N encodes a Tx bitstream according to a coding scheme of its corresponding stream. That is, the outer coders 206-1 to 206-N generate first order codewords for the respective streams. The inner coders 208-1 to 208-N encode the first order codewords for the respective streams provided from the outer coders 206-1 to 206-N according to a common coding scheme. That is, the inner coders 208-1 to 208-N generate second order codewords for the respective streams. Each of the modulators 210-1 to 210-N modulates the second order codeword provided from its corresponding inner coder 208, and thus converts the second order codeword into complex symbols.

The RF transmitters 212-1 to 212-N up-convert the complex symbols provided from its corresponding modulator 210 into RF signals, and thereafter transmit the RF signals through antennas. When using an Orthogonal Frequency Division Multiplexing (OFDM) scheme, each of the RF transmitters 212-1 to 212-N maps the complex symbols to subcarriers, and then coverts the symbols into time-domain symbols by performing an Inverse Fast Fourier Transform (IFFT) operation. Each of the RF transmitters 212-1 to 212-N generates OFDM symbols by inserting a Cyclic Prefix (CP) to the time-domain symbols, up-converts the OFDM symbols into an RF signal, and thereafter transmits the RF signal through each antenna.

Figure 3:
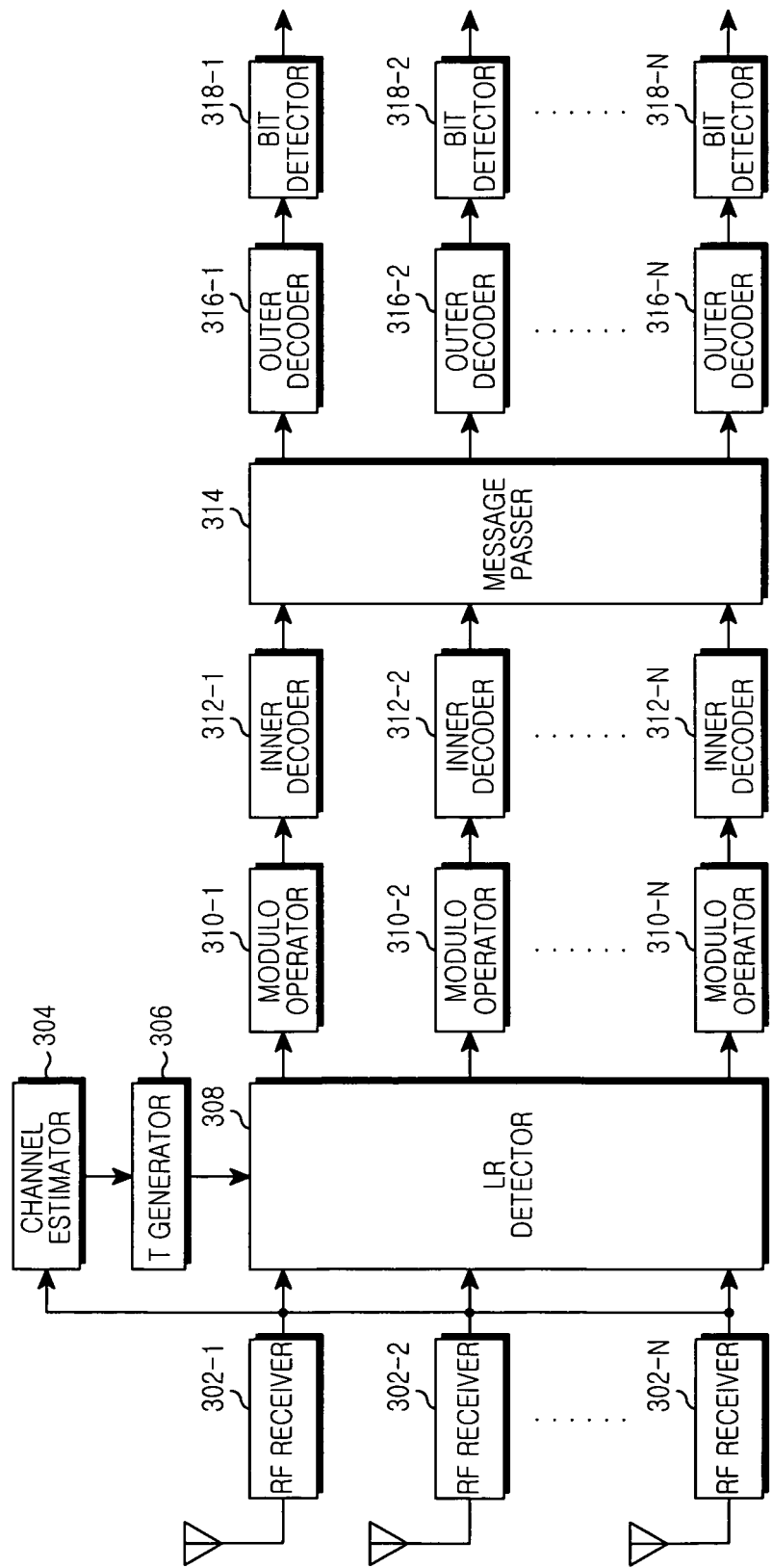
FIG. 3 is a block diagram illustrating a structure of a receiving end in a MIMO wireless communication system according to an exemplary embodiment of the present invention.

FIG. 3 is a block diagram illustrating a structure of a receiving end in a MIMO wireless communication system according to an exemplary embodiment of the present invention.

Referring to FIG. 3, the receiving end includes a plurality of RF receivers 302-1 to 302-N, a channel estimator 304, a T generator 306, an LR detector 308, a plurality of modulo operators 310-1 to 310-N, a plurality of inner decoders 312-1 to 312-N, a message passer 314, a plurality of outer decoders 316-1 to 316-N, and a plurality of bit detectors 318-1 to 318-N.

Each of the RF receivers 302-1 to 302-N converts an RF signal received through each antenna into a baseband signal. The channel estimator 304 estimates a channel with a transmitting end using a pre-agreed signal (e.g., a pilot signal) among Rx signals. In this case, the channel is represented with an N×N-sized channel matrix whose elements are channel coefficients for each Tx antenna and each Rx antenna. However, if the number of Rx antennas is greater than the number of Tx antennas, the channel matrix is represented with a rectangular matrix.

The T generator 306 determines a matrix T to be multiplied by the channel matrix to perform LR detection according to the LR algorithm. The matrix T is a matrix to be multiplied by the channel matrix to improve a condition number of the channel matrix, and is a unimodular matrix whose determinant is '1'. For example, the matrix T is determined by a Lenstra-Lenstra-Lovasz (LLL) algorithm. When using the LLL algorithm, the T generator 306 performs QR decomposition on the channel matrix between the transmitting end and the receiving end, and thereafter determines the matrix T using a Q-matrix and an R-matrix that are obtained by QR decomposition. The LLL algorithm is a well-known technique, and thus detailed descriptions of the LLL algorithm will be omitted. Details of the LLL algorithm are disclosed in a paper of "Near-Maximum-Likelihood Detection of MIMO Systems using MMSE-Based Lattice-Reduction", IEEE Proc. International Conference on Communications, 2004.

The LR detector 308 performs linear detection on a Tx signal block multiplied by the matrix T using the matrix T provided from the T generator 306. That is, the LR detector 308 multiplies an Rx signal block by an inverse matrix of multiplying the channel matrix and the matrix T. Herein, a signal block is a unit of constructing a codeword by inner coding/decoding. For example, if a single codeword consists of C symbols by inner coding/decoding, one signal block includes the C symbols in a time axis. An output value of the LR detector 308 is expressed by Equation 3:

$$\tilde{Y} = (TH)^{-1} Y \quad [\text{Eqn. 3}]$$

In Equation 3 above, $\tilde{Y}$ denotes a detection value of a Tx signal block multiplied by a matrix T, i.e., an output of the LR detector 308, H denotes a channel matrix, T denotes a lattice transformation matrix, and Y denotes an Rx signal block.

Each of the modulo operators 310-1 to 310-N performs a modulo operation on a value of its corresponding stream among detection values of the Tx signal block multiplied by the matrix T. In this case, an order of the modulo operation is '2'. In addition, an output of the modulo operators 310-1 to 310-N is a soft output, and thus includes values below a decimal point. Herein, the modulo operators 310-1 to 310-N perform the modulo operation on the respective detection values of a plurality of symbols constituting a codeword. Thus, an output of each of the modulo operators 310-1 to 310-N is a sequence of C soft-decision values, and one sequence represents one codeword. That is, the output of each of the modulo operators 310-1 to 310-N is soft-decision values of codewords according to a coding scheme for inner coding of the transmitting end. However, the soft-decision values of codewords, obtained by the respective modulo operators 310-1 to 310-N, do not represent original second order codewords generated in the transmitting end. This is because codewords are linearly summed, since the Rx signal block is multiplied by the matrix T. Sequences output from the modulo operators 310-1 to 310-N are expressed by Equation 4:

$$\tilde{C}^i = [(TH)^{-1} Y]_2 \quad [\text{Eqn. 4}]$$
$$= [(TH)^{-1}(HC^i + Z)]_2$$
$$= [T^{-1} C^i + (TH)^{-1} Z]_2$$
$$= [[[T^{-1}]_2 C^i]_2 + \tilde{Z}]_2$$

In Equation 4 above, $\tilde{C}^i$ denotes linearly summed codewords including noise, T denotes a lattice transformation matrix, H denotes a channel matrix, Y denotes an Rx signal block, $[\ ]_2$ denotes a soft modulo-2 operator, Z denotes noise, and $\tilde{Z}$ denotes noise multiplied by an inverse matrix of multiplying the matrix T and the channel matrix. Herein, a soft modulo-2 operation is performed as Equation 2.

Equation 4 above is split for each stream, as expressed by Equation 5:

$$\tilde{c}^i_{k+j} = \left[\left(\sum_{k=1}^{K} [it_{j,k}]_2 c^i_k\right) + \tilde{z}_j\right]_2 \quad [\text{Eqn. 5}]$$
$$= \left[\left[\sum_{k=1}^{K} [it_{j,k}]_2 c^i_k\right]_2 + \tilde{z}_j\right]_2$$
$$= [c^i_{k+j} + \tilde{z}_j]_2$$

In Equation 5, $\tilde{c}^i_{k+j}$ denotes a linearly summed $(k+j)^{th}$ codeword, $it_{j,k}$ denotes a $(j,k)^{th}$ element of the matrix T, K denotes the number of columns of the matrix T, $c^i_k$ denotes a transmitted $k^{th}$ codeword, $\tilde{z}_j$ denotes noise of a $j^{th}$ stream, and $[\ ]_2$ denotes a soft modulo-2 operator. Herein, the soft modulo-2 operation is performed as Equation 2.

Each of the inner decoders 312-1 to 312-N performs inner decoding on soft-decision values provided from its corresponding modulo operator 310. That is, each of the inner decoders 312-1 to 312-N performs inner decoding on the soft-decision values provided from its corresponding modulo operator 310 according to a decoding scheme corresponding to the inner coding scheme of the transmitting end. In this case, codewords generated by decoding of the inner decoders 312-1 to 312-N consist of LLR values, and do not represent first order codewords generated by outer coding of the transmitting end. This is because the codewords have been lineally summed by being multiplied by the matrix T in the LR detection process.

The message passer 314 restores LLR values representing the first order codewords generated by outer coding of the transmitting end using the codewords provided from the inner decoders 312-1 to 312-N. For this, the message passer 314 traces a summation process using the matrix T, that is, recognizes combinations of original codewords constituting each of the summed codewords. Further, the message passer 314 determines combinations of the summed codewords required to restore each of the original codewords. Thereafter, the message passer 314 restores the LLR value in a bit unit. For example, the message passer 314 restores the LLR value of each bit according to Equation 6:

$$L_{c_{i,j}} = 2\tanh^{-1}\left(\prod_{k=1}^{M}[t_{i,k}]_2 \tanh\left(\frac{L_{C_{k,j}}}{2}\right)\right) \quad [\text{Eqn. 6}]$$

In Equation 6 above, $L_{c_{i,j}}$ denotes a restored LLR value of a $j^{th}$ bit in an $i^{th}$ stream, M denotes the number of columns of the matrix T, $t_{i,k}$ denotes an $(i,k)^{th}$ element of the matrix T, $[\ ]_2$ denotes a modulo-2 operator, and $L_{C_{k,j}}$ denotes an LLR value before the $j^{th}$ bit is restored in a $k^{th}$ stream.

As represented in Equation 6, the message passer 314 restores LLR values using matrix T applied the modulo operation.

Each of the outer decoders 316-1 to 316-N decodes the LLR values of a codeword provided from the message passer 314 according to a decoding scheme of its corresponding stream. In other words, for the respective streams, the outer decoders 316-1 to 316-N decode first order codewords according to decoding schemes corresponding to outer coding schemes of the transmitting end, and generate LLR values of Tx bitstreams. The bit detectors 318-1 to 318-N detect the Tx bitstreams for the respective streams according to LLR values of the Tx bit-steams provided for the respective streams from the outer decoders 316-1 to 316-N.

Figure 4:
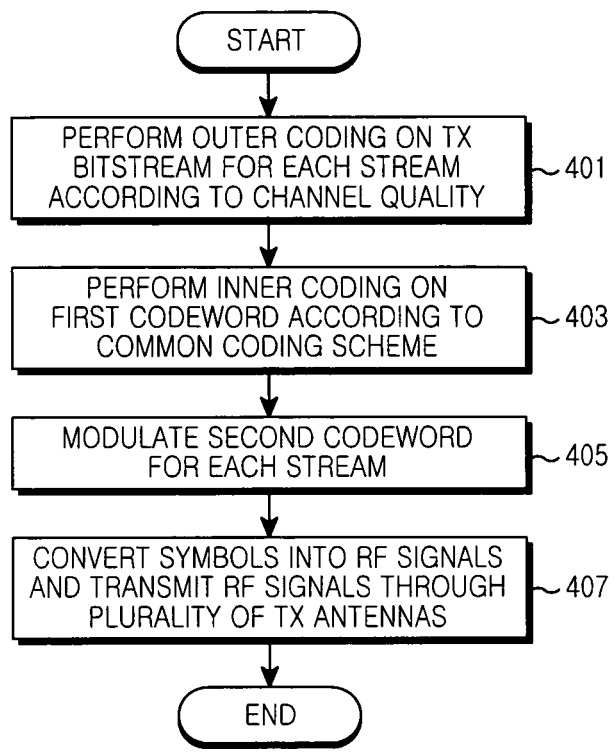
FIG. 4 is a flowchart illustrating a bitstream transmission process of a transmitting end in a MIMO wireless communication system according to an exemplary embodiment of the present invention.

FIG. 4 is a flowchart illustrating a bitstream transmission process of a transmitting end in a MIMO wireless communication system according to an exemplary embodiment of the present invention.

Referring to FIG. 4, the transmitting end performs outer coding on bitstreams to be transmitted using respective streams according to coding schemes determined by channel quality of the respective streams in step 401. In other words, the transmitting end generates first order codewords by coding the bitstreams according to the coding schemes for the respective streams.

After performing outer coding on the bitstreams, proceeding to step 403, the transmitting end performs inner coding on the first order codewords to be transmitted using the respective streams according to a common coding scheme. In other words, the transmitting end generates second order codewords by coding the first order codewords according to the common coding scheme.

After performing inner coding on the first order codewords, proceeding to step 405, the transmitting end modulates the second order codewords for the respective streams. That is, the transmitting end generates Tx symbols by modulating the second order codewords for the respective streams.

After generating the Tx symbols, proceeding to step 407, the transmitting end up-converts the Tx symbols into RF signals, and transmits the RF signals through a plurality of Tx antennas. When using the OFDM scheme, the transmitting end maps complex symbols to subcarriers for the respective streams, and coverts the symbols into time-domain symbols by performing an IFFT operation on the respective streams. Further, the transmitting end generates OFDM symbols by inserting a CP into the respective time-domain symbols, up-converts the OFDM symbols into RF signals, and thereafter transmits the RF signals through the plurality of Tx antennas.

Figure 5:
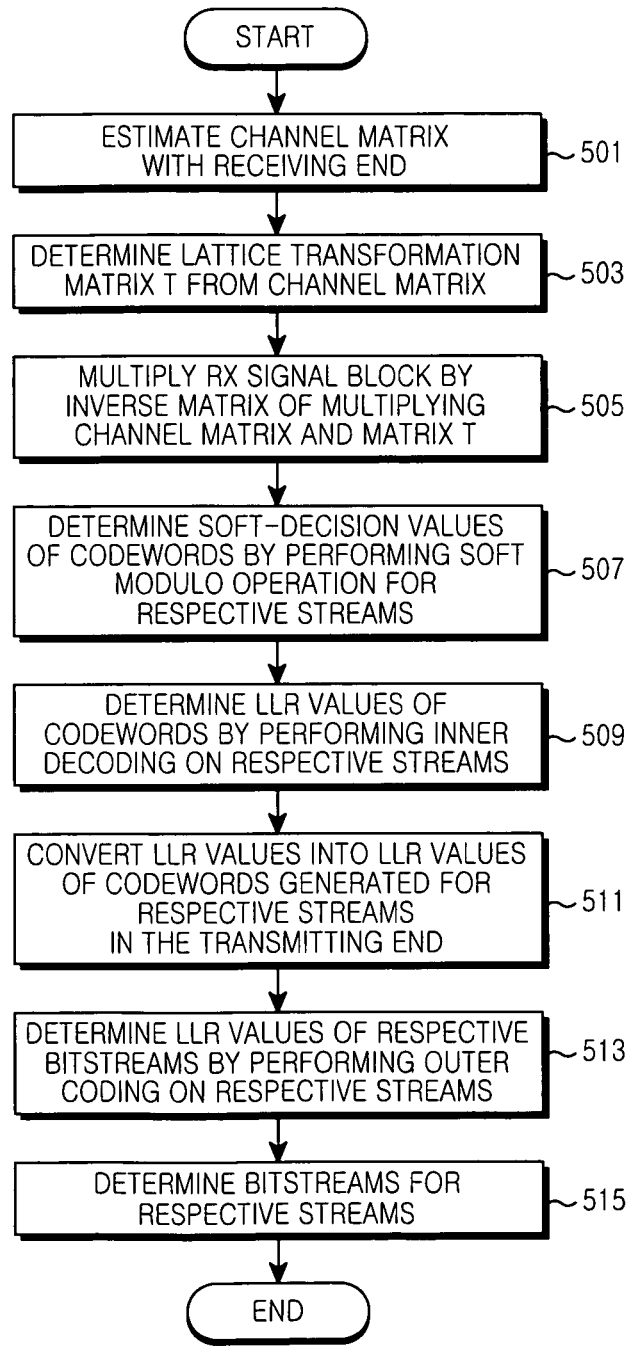
FIG. 5 is a flowchart illustrating a bitstream detection process of a receiving end in a MIMO wireless communication system according to an embodiment of the present invention.

FIG. 5 is a flowchart illustrating a bitstream detection process of a receiving end in a MIMO wireless communication system according to an embodiment of the present invention.

Referring to FIG. 5, the receiving end estimates a channel with a transmitting end using a pre-agreed signal (e.g., a pilot signal) among Rx signals in step 501. In this case, the channel is represented with an N×N-sized channel matrix whose elements are channel coefficients for each Tx antenna and each Rx antenna.

After estimating the channel matrix, proceeding to step 503, the receiving end determines a lattice transformation matrix T from the channel matrix. That is, the receiving end determines a matrix T to be multiplied by the channel matrix to perform LR detection according to the LR algorithm. For example, the matrix T is determined according to the LLL algorithm.

After determining the matrix T, proceeding to step 505, the receiving end multiplies an RX signal block by an inverse matrix of multiplying the channel matrix and the matrix T. In other words, using the matrix T, the receiving end performs linear detection on a Tx signal block multiplied by the matrix T. Herein, a signal block is a unit of constructing a codeword by inner coding/decoding.

In step 507, the receiving end determines soft-decision values of codewords by performing a soft modulo operation for respective streams. In this case, an order of the modulo operation is '2', and a resultant value of the modulo operation includes values below a decimal point. In addition, a result of the modulo operation is a sequence of C soft-decision values, and one sequence represents one codeword. However, the soft-decision values of the codewords, obtained by the modulo operation, do not represent original second order codewords generated in the transmitting end.

After determining the soft-decision values of the codewords, proceeding to step 509, the receiving end determines LLR values of the codewords by performing inner decoding on the respective streams. That is, the receiving end performs inner decoding on the soft-decision values of the codewords according to a decoding scheme corresponding to the inner coding scheme of the transmitting end. However, the LLR values of the codewords obtained by performing the inner decoding do not represent the first order codewords generated using the outer coding of the transmitting end.

After performing the inner decoding, proceeding to step 511, the receiving end converts the LLR values determined in step 509 into LLR values of the first order codewords generated for the respective streams in the transmitting end. More specifically, the receiving end traces a summation process using the matrix T, that is, recognizes combinations of original codewords constituting each of the summed codewords. In this case, instead of using the matrix T directly, the receiving end uses the matrix T after performing the modulo operation. That is, the receiving end performs the modulo operation on the matrix T, and thereafter recognizes a summation process of the codewords using the matrix T subjected to the modulo operation. Further, the receiving end determines combinations of the summed codewords required to restore each of the original codewords. Thereafter, the receiving end restores the LLR value in a bit unit. For example, the receiving end restores the LLR value of each bit according to Equation 6 above.

In step 513, the receiving end determines LLR values of respective bitstreams by performing outer coding on the respective streams. In other words, the receiving end decodes first order codewords of the respective streams according to decoding schemes corresponding to outer coding schemes of the transmitting end, and generates LLR values of Tx bitstreams for the respective streams.

After determining the LLR values of the Tx bitstreams for the respective streams, proceeding to step 515, for the respective streams, the receiving end determines the Tx bitstreams according to the LLR values of the Tx bit-steams.

The structures and operations of the transmitting end and the receiving end have been described above with reference to FIG. 2 to FIG. 5 under the assumption that the transmitting end uses a plurality of Tx streams. However, the present invention can also apply when a plurality of transmitting ends use a total of N streams. In this case, each transmitting end includes at least one constitutional elements for multiple Tx paths shown in FIG. 2. That is, when a transmitting end uses one stream, the transmitting end includes one outer coder 206, one inner coder 208, one modulator 210, and one RF transmitter 212.

According to the exemplary embodiments described with reference to FIG. 2 to FIG. 5, a modulation scheme (e.g., Binary Phase Shift Keying (BPSK) or Quadrature Phase Shift Keying (QPSK)) in which only two symbols exist in a real axis and an imaginary axis can be used. However, the present invention can also use a modulation scheme, in which three or more symbols exist in the real axis and the imaginary axis, by performing multilevel coding and decoding. When the multilevel coding and decoding are performed, the MIMO wireless communication system of the present invention is constructed as follows. For convenience of explanation, it is assumed that a transmitting end has two Tx antennas and a receiving end has two Rx antennas.

Figure 6:
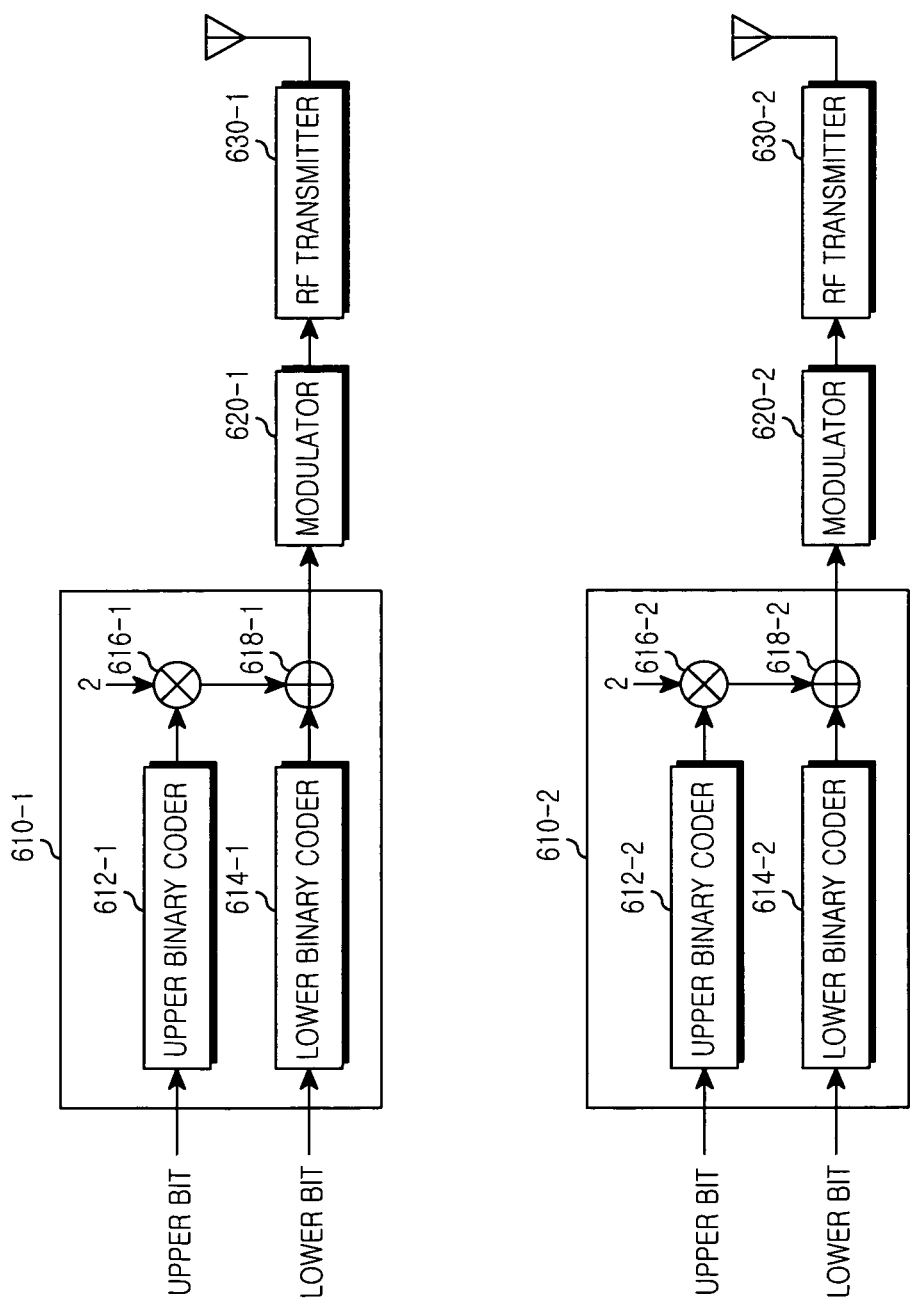
FIG. 6 is a block diagram illustrating a structure of a transmitting end for performing multilevel coding in a MIMO wireless communication system according to an exemplary embodiment of the present invention.

FIG. 6 is a block diagram illustrating a structure of a transmitting end for performing multilevel coding in a MIMO wireless communication system according to an exemplary embodiment of the present invention.

Referring to FIG. 6, the transmitting end includes two inner coders 610-1 and 610-2, two modulators 620-1 and 620-2, and two RF transmitters 630-1 and 630-2.

The two coders 610-1 and 610-2 have the same structure and function. The inner coder 610-1 corresponding to a first stream has a structure and function as follows. The inner coder 601-1 includes an upper binary coder 612-1, a lower binary coder 614-1, a multiplier 616-1, and an adder 618-1. A Tx bitstream of the first stream is divided in a unit of two bits. Among the two bits, an upper bit is input to the upper binary coder 612-1, and a lower bit is input to the lower binary coder 614-1. Thus, the upper binary coder 612-1 codes upper bits, and the lower binary coder 614-1 codes lower bits. For reliable decoding, the upper bit and the lower bit may be interleaved. Thereafter, randomly combined two streams may be respectively input to the upper binary coder 612-1 and the lower binary coder 614-1. The multiplier 616-1 multiplies the coded upper bits provided from the lower binary coder 614-1 by 2. The adder 618-1 adds the coded lower bits to multiplying the coded upper bits and 2. The inner coder 610-2 corresponding to a second stream has the same structure and operation as the first inner coder 610-1 corresponding to the first stream.

Each of the two modulators 620-1 and 620-2 modulates a coded value of its corresponding stream, i.e., one value selected from $\{0, 1, 2, 3\}$, and thus coverts the value into complex symbols. Each of the two RF transmitters 630-1 and 630-2 up-converts the complex symbols provided from its corresponding modulator 620 into an RF signal, and thereafter transmits the RF signal through each antenna.

Figure 7:
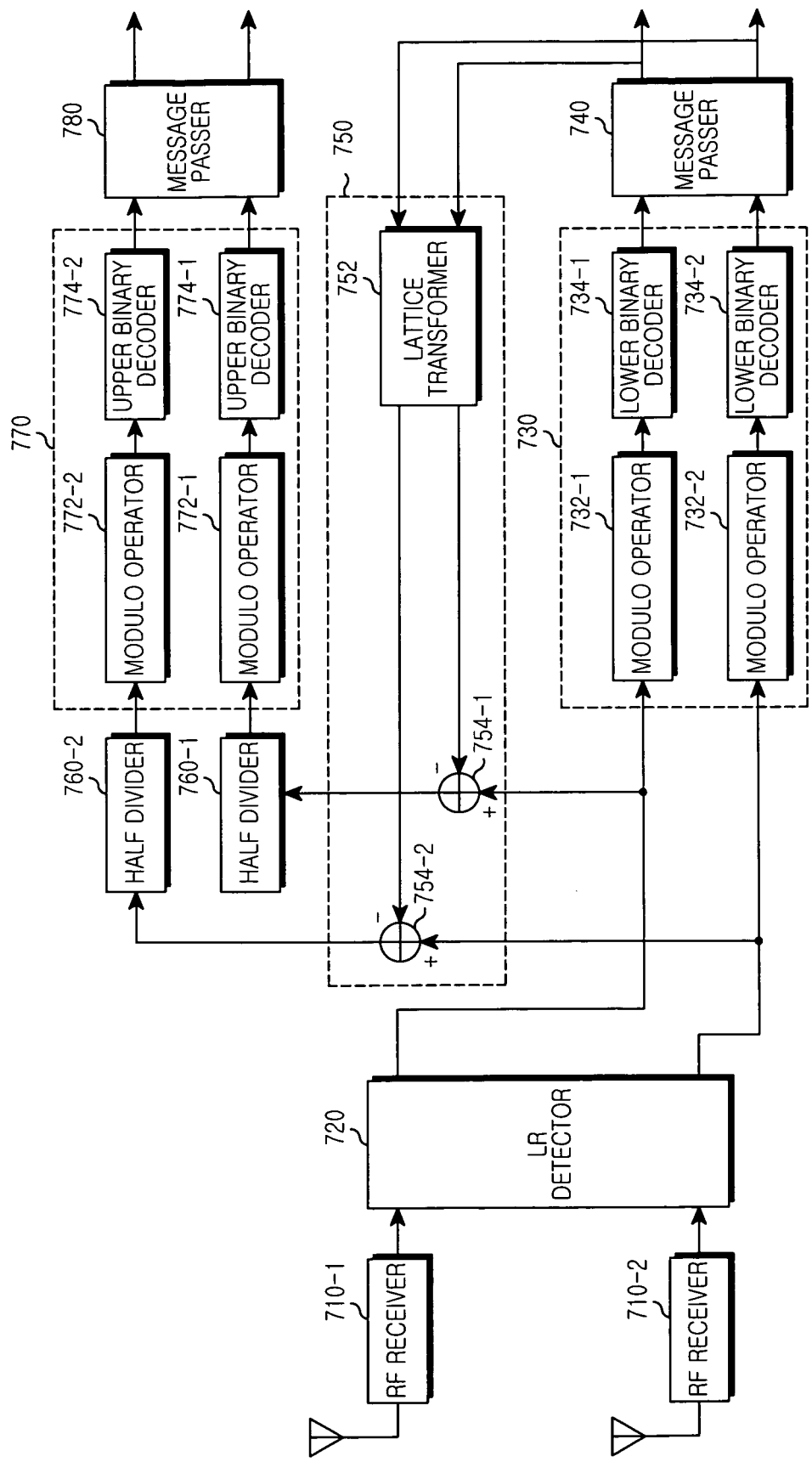
FIG. 7 is a block diagram illustrating a structure of a receiving end for performing multilevel decoding in a MIMO wireless communication system according to an exemplary embodiment of the present invention.

FIG. 7 is a block diagram illustrating a structure of a receiving end for performing multilevel decoding in a MIMO wireless communication system according to an exemplary embodiment of the present invention.

Referring to FIG. 7, the receiving end includes two RF receivers 710-1 and 710-2, an LR detector 720, a first inner decoder 730, a first message passer 740, an interference canceller 750, two half dividers 760-1 and 760-2, a second inner decoder 770, and a second message passer 780.

Each of the two RF receivers 710-1 and 710-2 converts an RF signal received through each antenna into a baseband signal. The LR detector 720 performs linear detection on a Tx signal block multiplied by a matrix T using a lattice transformation matrix T generated using a channel matrix. That is, the LR detector 720 multiplies an Rx signal block by an inverse matrix of multiplying the channel matrix and the matrix T. Herein, a signal block is a unit of constructing a codeword by inner coding/decoding.

The first inner decoder 730 includes two modulo operators 732-1 and 732-2 and two lower binary decoders 734-1 and 734-2. Each of the two modulo operators 732-1 and 732-2 performs a modulo operation on a value of its corresponding stream among detection values of the Tx signal block multiplied by the matrix T. In this case, an order of the modulo operation is '2'. In addition, an output of the two modulo operators 732-1 and 732-2 is a soft output, and includes values below a decimal point. For example, an output of the two modulo operators 732-1 and 732-2 is expressed by Equation 7:

$$\left[(HT)^{-1}\binom{y_1}{y_2}\right]_2 = \left[(T^{-1}H^{-1}) \cdot \left\{H\binom{v_1}{v_2} + \binom{z_1}{z_2}\right\}\right]_2 \quad \text{[Eqn. 7]}$$

$$= \left[\binom{it_{1,1}\ it_{1,2}}{it_{2,1}\ it_{2,2}}\binom{x_1^L + 2 \cdot x_1^U}{x_2^L + 2 \cdot x_2^U} + (T^{-1}H^{-1})\binom{z_1}{z_2}\right]_2$$

$$= \left[\left[\binom{it_{1,1}\ it_{1,2}}{it_{2,1}\ it_{2,2}}\right]_2 \left[\binom{x_1^L + 2 \cdot x_1^U}{x_2^L + 2 \cdot x_2^U}\right]_2 + \binom{\tilde{z}_1}{\tilde{z}_2}\right]_2$$

$$= \left[\left[\binom{it_{1,1}\ it_{1,2}}{it_{2,1}\ it_{2,2}}\right]_2 \left[\binom{x_1^L}{x_2^L}\right]_2 + \binom{\tilde{z}_1}{\tilde{z}_2}\right]_2$$

$$= \left[\left[\binom{[it_{1,1}]_2 x_1^L + [it_{1,2}]_2 x_2^L}{[it_{2,1}]_2 x_1^L + [it_{2,2}]_2 x_2^L}\right]_2 + \binom{\tilde{z}_1}{\tilde{z}_2}\right]_2$$

$$= \left[\binom{x_3^L}{x_4^L} + \binom{\tilde{z}_1}{\tilde{z}_2}\right]_2$$

$$= \frac{[x_3^L + \tilde{z}_1]_2}{[x_4^L + \tilde{z}_2]_2}$$

In Equation 7 above, H denotes a channel matrix, T denotes a lattice transformation matrix, $y_k$ denotes a $k^{th}$ row of an Rx signal block, $[\ ]_2$ denotes a soft modulo-2 operator, $v_k$ is a $k^{th}$ row of a Tx signal block, $z_k$ denotes noise of a $k^{th}$ stream, $it_{j,k}$ denotes a $(j,k)^{th}$ element of an inverse matrix of the matrix T, $x_k^L$ denotes a lower bit of a $k^{th}$ Tx bitstream, $x_k^U$ denotes an upper bit of the $k^{th}$ Tx bitstream, and $\tilde{z}_k$ denotes noise of the $k^{th}$ stream in which the inverse matrix of the matrix T is multiplied by the inverse matrix of the channel matrix.

The two lower binary decoders 734-1 and 734-2 decode soft-decision values of codewords provided for the respective streams from the two modulo operators 732 and thus generate LLR values of lower bits for respective streams. In this case, the LLR values generated by the two lower binary decoders 734-1 and 734-2 do not represent codewords generated in the transmitting end. This is because the Rx signal block is multiplied by the matrix T, and thus codewords are linearly summed.

The first message passer 740 restores LLR values representing Tx bitstreams of the transmitting end using the codewords provided for respective streams from the first inner decoder 730. For this, the first message passer 740 traces a summation process using the matrix T, that is, recognizes combinations of original codewords constituting each of the summed codewords. Further, the first message passer 740 determines combinations of the summed codewords required to restore each of the original codewords. Thereafter, the first message passer 740 restores the LLR value in a bit unit.

The interference canceller 750 includes a lattice transformer 752 and two adders 754-1 and 754-2. The lattice transformer 752 multiplies an inverse matrix of the matrix T by the LLR values of the lower bits provided for the respective streams from the first message passer 740. For the respective streams, the two adders 754-1 and 754-2 subtract the LLR values of the lower bits from detection values of a Tx signal block multiplied by the matrix T, wherein the LLR values are lattice-transformed by the lattice transformer 752 and the detection values are provided from the LR detector 720. That is, the interference canceller 750 removes components of lower bitstreams from the detection values generated by the LR detector 720 and detected for the respective streams from the Tx signal block multiplied by the matrix T. A function of the interference canceller 750 can be expressed by Equation 8

$$\tilde{Y}' = (HT)^{-1}\begin{pmatrix}y_1\\y_2\end{pmatrix} - T^{-1}\begin{pmatrix}x_1^L\\x_2^L\end{pmatrix}\quad\text{[Eqn. 8]}$$

$$= \left\{T^{-1}\begin{pmatrix}x_1^L + 2\cdot x_1^U\\x_2^L + 2\cdot x_2^U\end{pmatrix} + \begin{pmatrix}\tilde{z}_1\\\tilde{z}_2\end{pmatrix}\right\} - T^{-1}\begin{pmatrix}x_1^L\\x_2^L\end{pmatrix}$$

$$= T^{-1}\left\{\begin{pmatrix}x_1^L + 2\cdot x_1^U\\x_2^L + 2\cdot x_2^U\end{pmatrix} - \begin{pmatrix}x_1^L\\x_2^L\end{pmatrix}\right\} + \begin{pmatrix}\tilde{z}_1\\\tilde{z}_2\end{pmatrix}$$

$$= T^{-1}\begin{pmatrix}2\cdot x_1^U\\2\cdot x_2^U\end{pmatrix} + \begin{pmatrix}\tilde{z}_1\\\tilde{z}_2\end{pmatrix}$$

In Equation 8 above, $\tilde{Y}'$ denotes an Rx signal block not including a lower bit component, H denotes a channel matrix, T denotes a lattice transformation matrix, $y_k$ denotes a $k^{th}$ row of an Rx signal block, $x_k^L$ denotes a lower bit of a $k^{th}$ Tx bitstream, $x_k^U$ denotes an upper bit of the $k^{th}$ Tx bitstream, and $\tilde{z}_k$ denotes noise of the $k^{th}$ stream in which the inverse matrix of the matrix T is multiplied by the inverse matrix of the channel matrix.

The two half dividers 760-1 and 760-2 divide the detection values, provided from the interference canceller 750, by 2. Herein, since components of lower bitstreams of the detection values are removed, the provided detection values are detection values of upper bitstreams for the respective streams. An output of the two half dividers 760-1 and 760-2 can be expressed by Equation 9:

$$\left[\frac{1}{2}\cdot\tilde{Y}'\right] = \left[\frac{1}{2}\left(T^{-1}\begin{pmatrix}2\cdot x_1^U\\2\cdot x_2^U\end{pmatrix} + \begin{pmatrix}\tilde{z}_1\\\tilde{z}_2\end{pmatrix}\right)\right]_2\quad\text{[Eqn. 9]}$$

$$= \left[\left(T^{-1}\begin{pmatrix}x_1^U\\x_2^U\end{pmatrix} + \begin{pmatrix}\tilde{z}_1/2\\\tilde{z}_2/2\end{pmatrix}\right)\right]_2$$

$$= \left[\left(T^{-1}\begin{pmatrix}x_1^U\\x_2^U\end{pmatrix} + \frac{\tilde{z}_1}{\tilde{z}_2}\right)\right]_2$$

$$= \left[\left(\begin{pmatrix}x_3^U\\x_4^U\end{pmatrix} + \frac{\tilde{z}_1}{\tilde{z}_2}\right)\right]_2$$

In Equation 9 above, $\tilde{Y}'$ denotes an Rx signal block not including a lower bit component, H denotes a channel matrix, T denotes a lattice transformation matrix, $x_k^U$ denotes an upper bit of the $k^{th}$ Tx bitstream, and $\tilde{z}_k$ denotes noise of the $k^{th}$ stream in which the inverse matrix of the matrix T is multiplied by the inverse matrix of the channel matrix.

The second inner decoder 770 includes two modulo operators 772-1 and 772-2 and two upper binary decoders 774-1 and 774-2. The two modulo operators 772-1 and 772-2 perform a modulo operation on the detection values of the halved upper bitstreams provided for the respective streams from the two half dividers 760-1 and 760-2. In this case, an order of the modulo operation is 2. In addition, an output of the two modulo operators 772-1 and 772-2 is a soft output, and includes values below a decimal point. The two upper binary decoders 774-1 and 774-2 decode soft-decision values of codewords provided for the respective streams from the two modulo operators 772-1 and 772-2 and thus generate LLR values of upper bits for the respective streams. In this case, the LLR values generated by the two modulo operators 772-1 and 772-2 do not represent codewords generated in the transmitting end. This is because the Rx signal block is multiplied by the matrix T, and thus codewords are linearly summed.

The second message passer 780 restores LLR values representing Tx bitstreams of the transmitting end using the codewords provided for respective streams from the second inner decoder 770. For this, the second message passer 780 traces a summation process using the matrix T, that is, recognizes combinations of original codewords constituting each of the summed codewords. Further, the second message passer 780 determines combinations of the summed codewords required to restore each of the original codewords. Thereafter, the second message passer 780 restores the LLR value in a bit unit.

Figure 8:
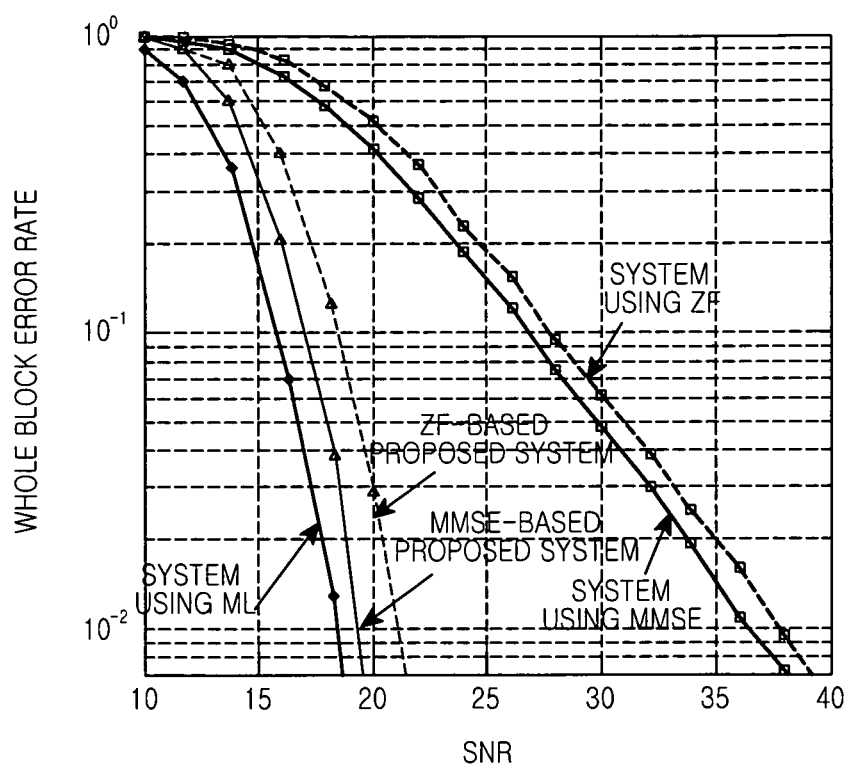
FIG. 8 is a graph illustrating performance of a MIMO wireless communication system according to an exemplary embodiment of the present invention.

FIG. 8 is a graph illustrating performance of a MIMO wireless communication system according to an exemplary embodiment of the present invention. The graph of FIG. 8 shows a result obtained by performing a simulation for measuring performance of the MIMO wireless communication system. In FIG. 8, a horizontal axis represents a Signal to Noise Ratio (SNR), and a vertical axis represents a whole block error rate.

In the simulation, it is assumed that a plurality of MSs transmit one stream and one BS receives four streams. Each MS uses 16-Quadrature Amplitude Modulation (QAM). A lower coding scheme uses a ¼ turbo code. An upper coding scheme uses a ¾ turbo code. The lower coding scheme and the upper coding scheme perform inner iterations up to 8 times. An input bitstream has a length of 100 in the lower coding scheme and has a length of 300 in the upper coding scheme. Further, each MS transmits two codewords in one signal block duration, i.e., transmits 200 complex symbols.

As shown in FIG. 8, a system of the present invention has significantly superior performance to a system using only either a Zero Forcing (ZF) method or a Minimum Mean Square Error (MMSE) method. In addition, when the system of the present invention uses the MMSE, a diversity order is the same as that of a system using a Maximum Likelihood (ML) having optimal performance, and performance deterioration of about 1.3 dB occurs to maintain an outage of 0.01%.

According to exemplary embodiments of the present invention, detection based on an LR algorithm is performed to support different coding schemes for respective streams using dual coding or dual decoding. Therefore, system performance can be improved with low complexity.

Although the present disclosure has been described with an exemplary embodiment, various changes and modifications may be suggested to one skilled in the art. It is intended that the present disclosure encompass such changes and modifications as fall within the scope of the appended claims.

What is claimed is:

1. A receiving-end apparatus having a plurality of Receive (Rx) antennas in a Multiple Input Multiple Output (MIMO) wireless communication system, the apparatus comprising:
a plurality of operators configured to determine soft-decision values for respective streams by performing a soft modulo operation on respective symbol values included in a received signal block multiplied by an inverse matrix, the inverse matrix comprising a product of a channel matrix and a lattice transformation matrix T;
a plurality of inner decoders configured to determine Log Likelihood Ratio (LLR) values of codewords according to coding schemes for the respective streams by decoding the soft-decision values for the respective streams using a common decoding scheme;
a passer configured to restore LLR values representing the codewords generated in a transmitting end from the LLR values using the lattice transformation matrix T; and
a plurality of outer decoders configured to determine LLR values of Transmit (Tx) bitstreams for the respective streams by decoding the LLR values representing the codewords generated in the transmitting end for the respective streams using decoding schemes for the respective streams,
wherein the passer is configured to determine a combination of original codewords constituting each of linearly summed codewords due to multiplication with the lattice transformation matrix T, and thereafter restore LLR values representing the original codewords in a bit unit.

2. The apparatus of claim 1, wherein the passer performs a modulo operation on the lattice transformation matrix T, and thereafter determines the combination of the original codewords using the lattice transformation matrix T subjected to the modulo operation.

3. The apparatus of claim 2, further comprising:
an estimator configured to estimate the channel matrix with at least one transmitting end; and
a generator configured to determine the lattice transformation matrix T from the channel matrix.

4. The apparatus of claim 2, wherein the passer restores the LLR values of the codewords generated in the transmitting end according to:

$$L_{c_{i,j}} = 2\tanh^{-1}\left(\prod_{k=1}^{M} [t_{i,k}]_2 \tanh\left(\frac{L_{c_{k,j}}}{2}\right)\right),$$

where $L_{c_{i,j}}$ denotes a restored LLR value of a $j^{th}$ bit in an $i^{th}$ stream, M denotes the number of columns of the lattice transformation matrix T, $t_{i,k}$ denotes an $(i,k)^{th}$ element of the matrix T, and $L_{c_{k,j}}$ denotes an LLR value before the $j^{th}$ bit is restored in a $k^{th}$ stream.

5. The apparatus of claim 1, further comprising:
an estimator configured to estimate the channel matrix with at least one transmitting end; and
a generator configured to determine the lattice transformation matrix T from the channel matrix.

6. The apparatus of claim 5, wherein the generator generates the lattice transformation matrix T using a Lenstra-Lenstra-Lovasz (LLL) algorithm.

7. The apparatus of claim 1, wherein the soft modulo operation is performed according to:

$$L(c_i \mid \tilde{y}_j) \approx C_{c_i} - 4\frac{\tilde{E}_s}{2\tilde{\sigma}_j^2}\left(\tilde{y}_j - \frac{\tilde{y}_o + \tilde{y}_e}{2}\right)\left(\frac{\tilde{y}_o - \tilde{y}_e}{2}\right)$$

where $c_i$ denotes a bit transmitted from $j^{th}$ transmitting end, $\tilde{y}_j$ denotes $j^{th}$ element of received signal vector after Lattice Reduction (LR) algorithm, $C_{c_i}$ denotes a variable representing a priori probability on transmit bit, $\tilde{E}_s$ denotes transmitting power of each transmitting end, $\tilde{\sigma}_j^2$ denotes a power of noise after LR algorithm, $\tilde{y}_o$ denotes the nearest odd number to $\tilde{y}_j$, $\tilde{y}_e$ denotes the nearest even number to $\tilde{y}_j$, wherein, the variable $C_{c_i}$ is '0' when probabilities to transmit bit 1 and bit 0 are identically 1/2.

8. The apparatus of claim 1, wherein the soft modulo operation is performed by using a sum of the nearest odd number to a $j^{th}$ element of a received signal vector after a Lattice Reduction (LR) algorithm and the nearest even number to the $j^{th}$ element of the received signal vector after the LR algorithm, and a difference between the nearest odd number to the $j^{th}$ element of the received signal vector after the LR algorithm and the nearest even number to the $j^{th}$ element of the received signal vector after the LR algorithm.

9. A transmitting-end apparatus having at least one Transmit (Tx) antenna in a Multiple Input Multiple Output (MIMO) wireless communication system, the apparatus comprising:
at least one outer coder configured to perform outer coding on Tx bitstreams for respective streams using coding schemes for the respective streams;
at least one inner coder configured to perform inner coding on codewords generated by the outer coding using a common coding scheme;
at least one modulator configured to modulate the codewords generated by the inner coding to convert the codewords into complex symbols;
a controller configured to provide Modulation and Coding Scheme (MCS) levels for the respective streams determined according to channel quality between the transmitting end and a receiving end to the at least one outer coder, the at least one inner coder, and the at least one modulator; and
a plurality of transmitters configured to transmit the complex symbols through Tx antennas.

10. The apparatus of claim 9, wherein, if at least one different transmitting end simultaneously transmit signals to one receiving end, the at least one inner coder uses the same inner coding scheme used in the at least one different transmitting end.

11. A method of operating a receiving end having a plurality of Receive (Rx) antennas in a Multiple Input Multiple Output (MIMO) wireless communication system, the method comprising:
determining soft-decision values for respective streams by performing a soft modulo operation on respective symbol values included in a received signal block multiplied by an inverse matrix, the inverse matrix comprising a product of a channel matrix and a lattice transformation matrix T;
determining Log Likelihood Ratio (LLR) values of codewords according to coding schemes for the respective streams by decoding the soft-decision values for the respective streams using a common decoding scheme; and
restoring the LLR values representing the codewords generated in a transmitting end comprises;
determining LLR values of Transmit (Tx) bitstreams for the respective streams by decoding the LLR values representing the codewords generated in the transmitting end for the respective streams using decoding schemes for the respective streams; and
determining a combination of original codewords constituting each of linearly summed codewords due to multiplication with the lattice transformation matrix T, and thereafter restoring LLR values representing the original codewords in a bit unit.

12. The method of claim 11, wherein the determining of the combination of the original codewords comprises:
performing a modulo operation on the lattice transformation matrix T; and
determining the combination of the original codewords using the lattice transformation matrix T subjected to the modulo operation.

13. The method of claim 12, wherein the LLR values of the codewords generated in the transmitting end are restored according to:

$$L_{c_{i,j}} = 2\tanh^{-1}\left(\prod_{k=1}^{M} [t_{i,k}]_2 \tanh\left(\frac{L_{C_{k,j}}}{2}\right)\right),$$

where $L_{c_{i,j}}$ denotes a restored LLR value of a $j^{th}$ bit in an $i^{th}$ stream, M denotes the number of columns of the lattice transformation matrix T, $t_{i,k}$ denotes an $(i,k)^{th}$ element of the matrix T, and $L_{c_{k,j}}$ denotes an LLR value before the $j^{th}$ bit is restored in a $k^{th}$ stream.

14. The method of claim 12, further comprising:
estimating the channel matrix with at least one transmitting end; and
determining the lattice transformation matrix T from the channel matrix.

15. The method of claim 13, wherein the lattice transformation matrix T is generated using a Lenstra-Lenstra-Lovasz (LLL) algorithm.

16. The method of claim 11, further comprising:
estimating the channel matrix with at least one transmitting end; and
determining the lattice transformation matrix T from the channel matrix.

17. The method of claim 11, wherein the soft modulo operation is performed according to:

$$L(c_i \mid \tilde{y}_j) \approx C_{c_i} - 4\frac{\tilde{E}_s}{2\tilde{\sigma}_j^2}\left(\tilde{y}_j - \frac{\tilde{y}_o + \tilde{y}_e}{2}\right)\left(\frac{\tilde{y}_o - \tilde{y}_e}{2}\right)$$

where $c_i$ denotes a bit transmitted from $j^{th}$ transmitting end, $\tilde{y}_j$ denotes $j^{th}$ element of received signal vector after Lattice Reduction (LR) algorithm, $C_{c_i}$ denotes a variable representing a priori probability on transmit bit, $\tilde{E}_s$ denotes transmitting power of each transmitting end, $\tilde{\sigma}_j^2$ denotes a power of noise after LR algorithm, $\tilde{y}_o$ denotes the nearest odd number to $\tilde{y}_j$, $\tilde{y}_e$ denotes the nearest even number to $\tilde{y}_j$, wherein, the variable $C_{c_i}$ is '0' when probabilities to transmit bit 1 and bit 0 are identically 1/2.

18. The method of claim 11, wherein the soft modulo operation is performed by using a sum of the nearest odd number to a $j^{th}$ element of a received signal vector after a Lattice Reduction (LR) algorithm and the nearest even number to the $j^{th}$ element of the received signal vector after the LR algorithm, and a difference between the nearest odd number to the $j^{th}$ element of the received signal vector after the LR algorithm and the nearest even number to the $j^{th}$ element of the received signal vector after the LR algorithm.

19. A method of operating a transmitting end having at least one Transmit (Tx) antenna in a Multiple Input Multiple Output (MIMO) wireless communication system, the method comprising:
performing, at an outer coder, outer coding on Tx bitstreams for respective streams using coding schemes for respective streams;
performing, at an inner coder, inner coding on codewords generated by the outer coding using a common coding scheme;
modulating, at a modulator, the codewords generated by the inner coding to convert the codewords into complex symbols;
providing, at a controller, Modulation and Coding Scheme (MCS) levels for the respective streams determined according to channel quality between the transmitting end and a receiving end to the outer coder, the inner coder, and the modulator; and
transmitting the complex symbols through Tx antennas.

20. The method of claim 19, wherein, if at least one different transmitting end simultaneously transmit signals to one receiving end, the outer coding is performed using the same inner coding scheme used in the at least one different transmitting end.

* * * * *